(12) United States Patent
Boyd

(10) Patent No.: US 6,623,282 B2
(45) Date of Patent: Sep. 23, 2003

(54) COMPONENT RETENTION SOCKET

(75) Inventor: Patrick D. Boyd, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/803,060

(22) Filed: Mar. 8, 2001

(65) Prior Publication Data

US 2002/0126463 A1 Sep. 12, 2002

(51) Int. Cl.$^7$ ............................................... H01R 12/00
(52) U.S. Cl. ............................. 439/83; 439/567; 439/56
(58) Field of Search .......................... 439/83, 558, 566, 439/554, 547, 56, 57, 58, 699.2, 188, 637, 567

(56) References Cited

U.S. PATENT DOCUMENTS

| 3,627,929 | A | * | 12/1971 | Vlijmen et al. | ............ 439/188 |
| 4,106,841 | A | * | 8/1978 | Vladic | ........................ 439/188 |
| 4,324,451 | A | * | 4/1982 | Ammon et al. | ............. 439/637 |
| 5,372,525 | A | * | 12/1994 | Wu et al. | ................ 439/699.2 |

OTHER PUBLICATIONS

George S. Brady & Henry R. Clauser, 12$^{th}$ Edition Materials Handbook, 1986, McGraw–Hill Book Company, pp. 628 and 629.*

"Lamp Sockets and Accessories", Chicago Miniature Lamp, Inc., http://www.sli–lighting.com/cml/databookpdf/2–62.pdf, 2001, p. 2–62, USA.

"4144 Series Relampable Socket", Chicago Miniature Lamp, Inc., http://www.sli–lighting.com/cml/databookpdf/2–76.pdf, 2001, p. 2–76, USA.

"3062 Series Relampable Incandescent Indicator Light", Chicago Miniature Lamp, Inc., http://www.sli–lighting.com/cml/databookpdf/4–60.pdf, 2001, p. 4–60, USA.

* cited by examiner

Primary Examiner—Tho D. Ta
(74) Attorney, Agent, or Firm—Robert G. Winkle

(57) ABSTRACT

A component retention socket, which allows through-hole mount electronic components to be attached to a substrate in a stabilized, vertical orientation, without requiring lead preparation.

12 Claims, 8 Drawing Sheets

COMPONENT RETENTION SOCKET

BACKGROUND OF THE INVENTION

1. Field of the Invention

The present invention relates to apparatus and methods for attaching a component to a substrate. In particular, the present invention relates to a socket for attaching an electronic component to a substrate.

2. State of the Art

In the fabrication of electronic devices, a variety of electronic components may be utilized. A number of these electronic components may be mounted to a substrate, which is used in the fabrication of the electronic device. Some of these electronic components are "through-hole mount" (THM) components, wherein leads of the electronic components extend through and are attached to the substrate. The electronic components may be active or passive, and may include, but are not limited to, crystals, oscillators, capacitors, diodes, resistors, and inductors. Within this application, the term "substrate" is defined to include motherboards, peripheral cards, cartridges, multi-chip module substrates, non-printed circuit board products, and similar structures, as will be evident to one skilled in the art.

FIG. 7 illustrates an electronic component 202 having a component body 204 and a pair of leads 206 extending therefrom. Generally, as shown in FIG. 8, such electronic components 202 are attached to a substrate 208 by forming plated vias 212, as known in the art, through the substrate 208, wherein the plated vias 212 are attached to traces (not shown) that make contact with other electrical components (not shown). The leads 206 of the electronic component 202 are inserted into the plated vias 212, such that they penetrate through the substrate 208. The component leads 206 are bent such that the component body 204 resides against the substrate 208. The component leads 206 may be bent prior to or after insertion into the plated vias 212. The component leads 206 are attached to the plated vias 212 using solder 214 applied by a wave solder process, as known in the art. The component body 204 may be secondarily attached to the substrate with an adhesive (not shown) and/or with a wire 218 (which encompasses the component body 204 and extends through the substrate 208). The wave soldering of the component leads 206 also secures the wire 218. It is, of course, understood that the secondary attachment is merely optional.

Another variation (not shown), as is known in the art, is for the component leads to be fashioned such that a portion of each component lead lies in contact with the substrate when the electronic component is surface mounted to the substrate. However, as will be known to one skilled in the art, these components are difficult to attached to the substrate due to their non-symmetrical configuration which requires placement offsets, due to the fragility of the component leads, and/or due to the round package configuration which may require special vacuum nozzles on the "pick and place" assembly equipment.

However, regardless of the configuration, the process of bending the component leads 206 results in substantial stresses on the seals (not shown) through which the component leads 206 enter the component body 204. These stresses may result in the fracturing of the seals, which can result in moisture infiltration that can have a performance impact, damage, or even destroy the electronic component 202. Furthermore, improper installation of the electronic component 202 may result in crossed component leads 206 that may render the electronic component 202 inoperable.

It is also known in the art that electronic components can be placed in a housing 222 to position the electronic components, as shown in FIG. 9. These electronic component housings 222 may include a chamber 224 for receiving the electronic component and channels 226 for receiving electronic component leads 228. Such electronic component housings 222 may be obtained from Chicago Miniature Lamp, Inc. of Hackensack, N.J., USA.

Therefore, it would be advantageous to develop apparatus and techniques to effectively attach an electronic component to a substrate, which lessens or eliminates the problems discussed above.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Figure 1:
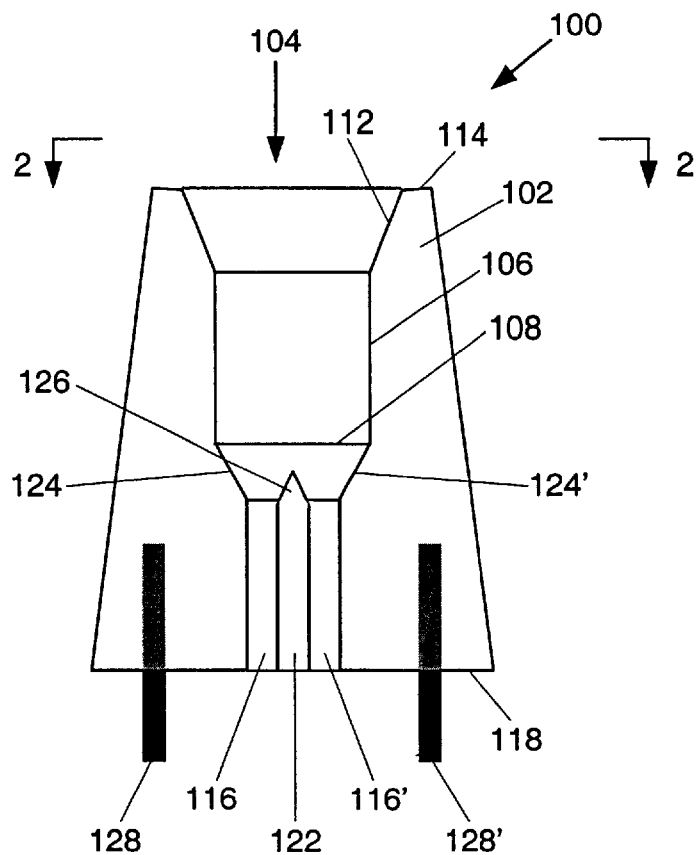
FIG. 1 is a side cross-sectional view of a first embodiment of a component retention socket, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implement within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention comprises a component retention socket which allows through-hole mount (THM) electronic components to be attached to a substrate, such as a motherboard, in a stabilized, vertical orientation, without requiring lead preparation (cutting, forming, etc.). The invention substantially reduces the risk of handling related damage to component throughout assembly process and post-assembly. The component retention socket protects component from damage due to shock and vibration, and/or incidental contact.

Figure 2:
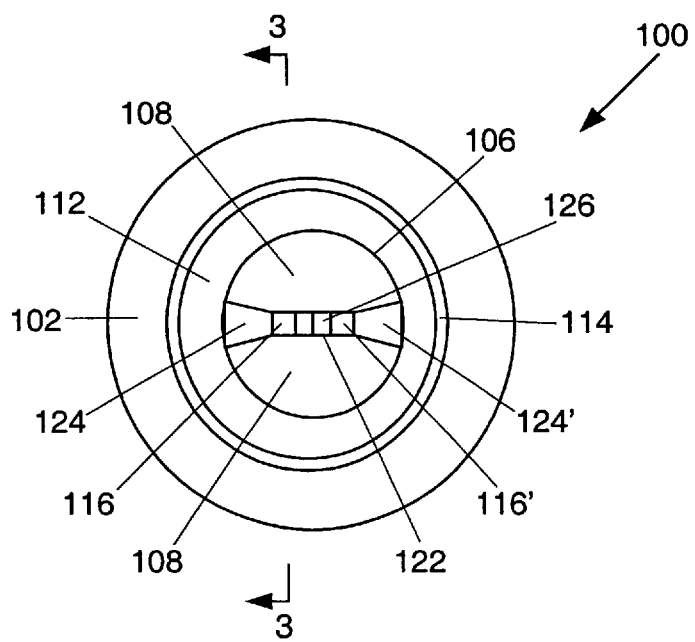
FIG. 2 is a top plan view of the component retention socket along lines 2—2 of FIG. 1, according to the present invention.
Figure 3:
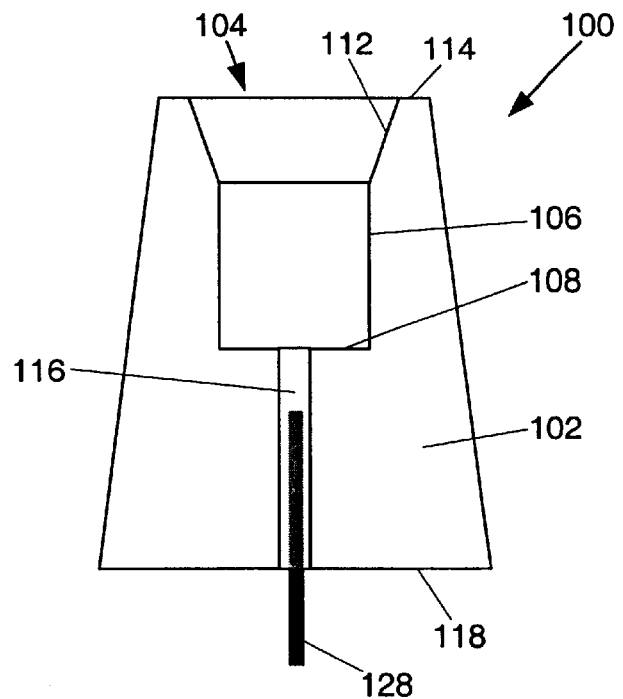
FIG. 3 is another side cross-sectional view of the component retention socket along lines 3—3 of FIG. 2, according to the present invention.

FIGS. 1, 2, and 3 illustrates a component retention socket 100 of the present invention comprising a housing 102 and a recess 104 formed therein. The socket recess 104 may comprise a component chamber 106, a component insertion stop 108, and a beveled guide 112 extending from a first surface 114 of the socket housing 102 to the component chamber 106. The socket recess 104 further comprises at least one lead guide channel 116 (shown as two lead guide channels 116 and 116') extending from the component chamber 106, proximate the component insertion stop 108, to a second surface 118 of the socket housing 102. The lead guide channels 116 and 116' include sloped walls 124 and 124' extending from the component chamber 106. The sloped walls 124 and 124' preferably slope to a point approximately one-quarter to one-third the distance from the component insertion stop 108 to the housing second surface 118.

The socket housing 102 should be constructed of an electrically non-conductive material, including polycarbonate materials, plastics, epoxy resins, nylons, and the like. The material used to construct the socket housing 102 should have sufficient hardness such that the component leads (see FIG. 4) cannot penetrate into the socket housing 102 during the insertion of an electronic component 132 (see FIG. 4). The component retention socket 100 may be fabricated using an injection mold process, milling, or other such fabrication process as will be evident to those skilled in the art. Further, the component retention socket 100 may be formed as a single unit, but the present invention is not so limited. The outside of the socket housing 102 should be shaped such that it can be easily and securely held by human hand during the assembly onto a substrate, as will be later discussed, but could be alternately shaped for placement or handling by a tool or other such implement.

When more than one lead guide channel 116 is present, at least one lead separator 122 may be positioned between each lead guide channel 116 (shown positioned between lead guide channels 116 and 116'). The lead separator 122 separates leads of a component to be inserted (see FIG. 4) into their respective guide channels 116 and 116', which prevents electrical shorts due to leads coming into contact with each other. Further, the lead separator 122 may include a separator wedge 126, which also assists in properly guiding the leads of an electronic component into the lead guide channels 116 and 116'.

The electronic socket 100 may include at least one substrate attachment mechanism 128 (shown as elements 128 and 128') extending from the socket housing second surface 118. The substrate attachment mechanisms 128, 128' are illustrated as solderable posts.

Figure 4:
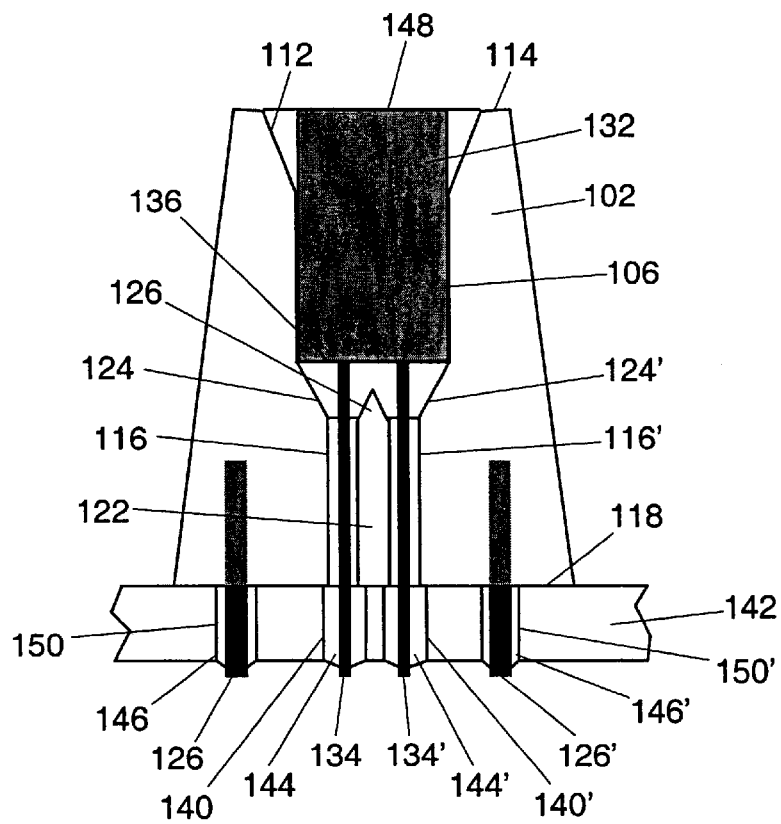
FIG. 4 is a side cross-sectional view of the component retention socket of FIG. 1 having an electronic component disposed therein, according to the present invention.

FIG. 4 illustrates the electronic socket 100 of FIG. 1 abutting a substrate 142 and having an electronic component 132 vertically oriented therein. The electronic component 132 may be active or passive, and may include, but are not limited to, crystals, oscillators, capacitors, diodes, resistors, and inductors. Leads 134, 134' extend from a first surface 136 of an electronic component 132 through lead guide channels 116 and 116", respectively. The electronic component leads 134, 134' extend through vias 140 and 140', respectively, in the substrate 142 and are attached thereto with solder 144 and 144', respectively. The electronic component leads 134, 134' may protrude from the substrate 142.

It is, of course, understood that the electronic component leads 134, 134' make electrical contact with the substrate 142 when such attachment is achieved. It is further understood that the substrate vias 140, 140' are preferably slightly larger that the lead guide 116, 116' to prevent the leads 134, 134' from contacting the substrate 142 during insertion, which may cause misalignment and may result in stress on component seals (discussed previously). As further shown in FIG. 4, the substrate attachment mechanisms 128 and 128' (solderable posts) extend through vias 150 and 150' and are also attached to the substrate 142 with solder 146 and 146', respectively.

The component chamber 106 is, preferably, designed to closely conform to the length, width, height, and/or diameter of an electronic component 132. The dimensions should allow for the easy insertion of the electronic component 132, but limit movement of the electronic component 132 inside the component chamber 106 to the minimum degree possible.

The beveled guide 112 tapers into the component chamber 106 (i.e., wider proximate the socket housing first surface 114 than it is proximate the component chamber 106) to facilitate the insertion of the electronic component 132. The bevel guide 112 preferably terminates at a point no greater than about one-third of the electronic component length from the socket housing first surface 114. The bevel guide 112 should preferably provide sufficient clearance to allow entry of an implement, such as a tweezers, to grasp the electronic component 132 (see FIG. 4) for removal.

The socket housing second surface 118 is preferably substantially planar to contact the substrate 142, and is designed to consume the minimum amount of a substrate surface area necessary to provide stability from the time of placement at least until the wave solder process. Preferably, the contact of the socket housing second surface 118 with the substrate 142 also provides stability after the attachment process.

The lead guide channels 116, 116' preferably maintain a uniform dimension from the termination of the sloped wall 124, 124' to the socket housing second surface 118. Furthermore, the lead guide channels 116, 116' should be sized to prevent the electronic component leads 134, 134' from binding during insertion, but not large enough to allow entry of more than a single lead.

The component insertion stop 108 provides a stopping point for component insertion, such that a second surface 148 of the electronic component 132 is typically, but not necessarily, "flush" with the socket housing first surface 114. The positioning of the component insertion stop 108 in combination with the length of the lead guide channels 116 and 116' are designed to allow proper penetration of the electronic component leads 134, 134' through the substrate 142. This allows for the use of the electronic component 132 without the need to alter the size or shape of the electronic component leads 134, 134', as would be needed for horizontal assembly (as discussed above regarding prior art assembly). The elimination of the need to alter the component leads 134, 134' substantially reduces the incidence of component defects (e.g., package seal damage) resulting from bending the component leads 134, 134' or as otherwise caused by handling.

As it will understood by those skilled in the art, the utilization of the component retention socket 100 reduces the number of required manufacturing processes and operations. Moreover, the component retention socket 100 reduces susceptibility of the electronic component 132 to damage due to shock, vibration, or incidental contact, both during and after assembly.

It is, of course, understood that the overall height of the component retention socket 100 and the properly installed electronic component 132 should not exceed requisite height restrictions.

The socket housing 102 may include a positional reference mechanism (not shown) to ensure proper placement orientation of component, if necessary (e.g., polarity constraints and the like), into the socket, and/or the socket into the substrate. The reference mechanism could be a visual mark or a non-symmetrical pin extending from the socket housing 102 through the substrate 142.

Figure 5A:
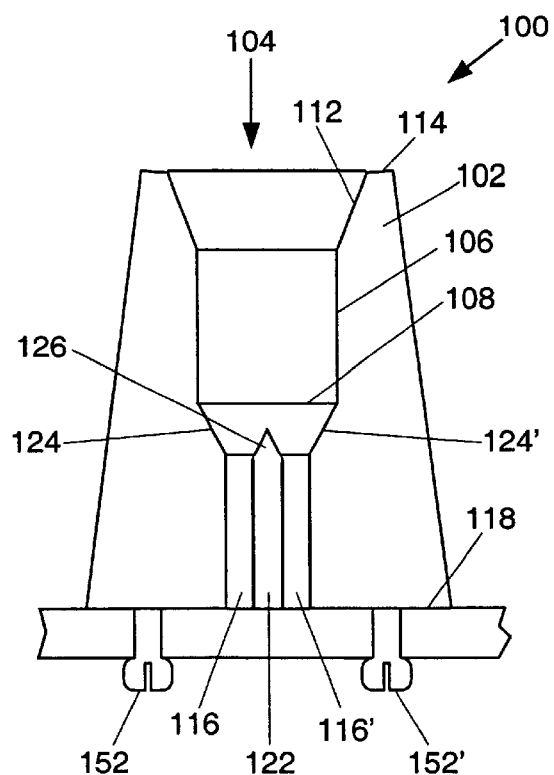
FIGS. 5a–5f are side cross-sectional views of component retention sockets having various embodiments of substrate attachment mechanisms, according to the present invention.
Figure 5B:
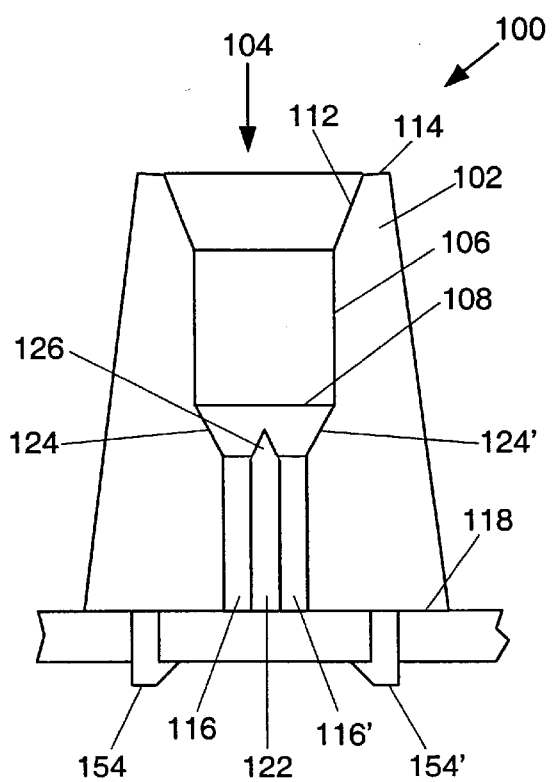
Figure 5C:
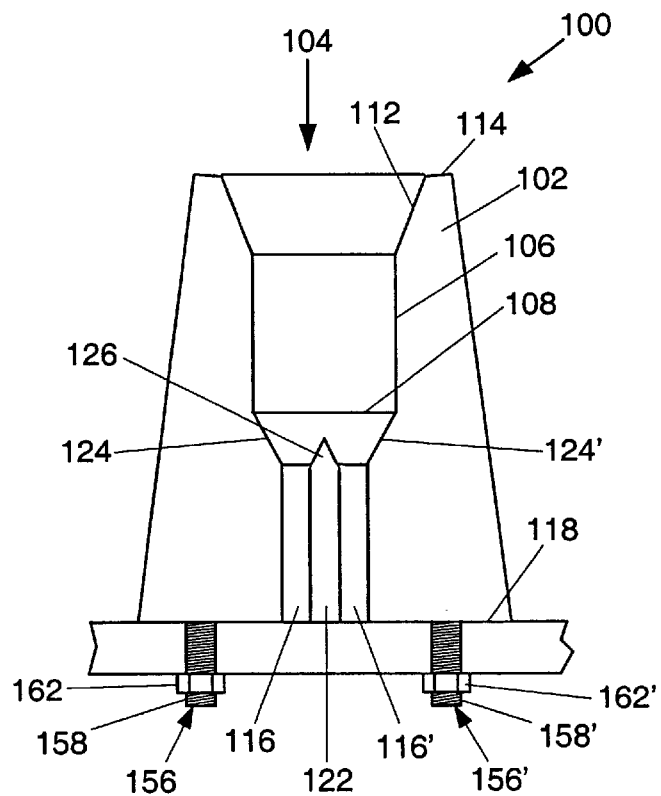

FIGS. 5a–5c illustrate various alternate substrate attachment mechanisms, which may be an integral part of the socket housing 102 (formed at the time of molding thereof). The substrate attachment mechanisms shown in FIGS. 5a–5c preferably extend through the substrate 142 and a sufficient distance beyond to provide a robust attachment to the substrate. Additionally, they should preferably be of sufficient thickness and durability to resist shearing (i.e., disassociation from the socket housing), fracture, or deformation from shock, vibration, and/or incidental contact. The substrate attachment mechanisms preferably allow removal of the component retention socket 100 from the substrate 142 with a reasonable amount of effort, and without rendering the component retention socket 100 unusable. FIG. 5a illustrates the substrate attachment mechanisms 152 and 152' as split pegs. FIG. 5b illustrates the substrate attachment mechanisms 154 and 154' as board locks. FIG. 5c illustrates the substrate attachment mechanisms 156 and 156' as threaded posts 158, 158' and nuts 162, 162'.

Figure 5D:
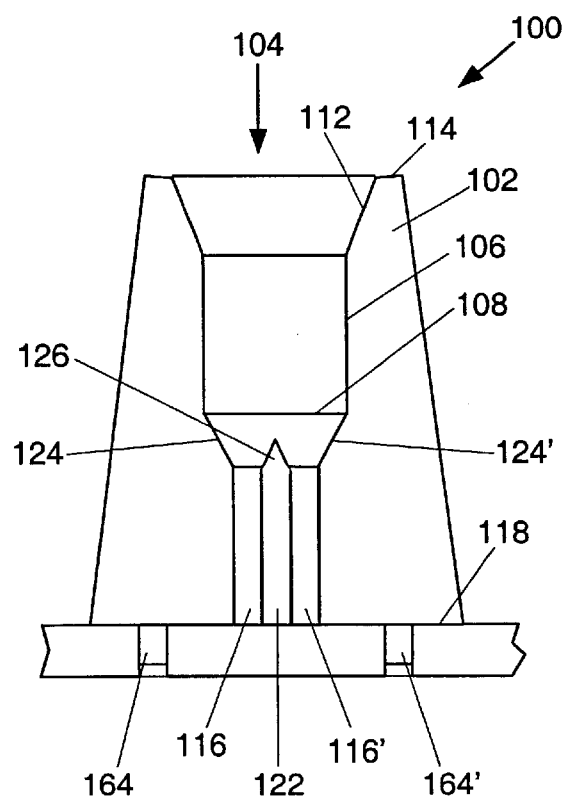
Figure 5E:
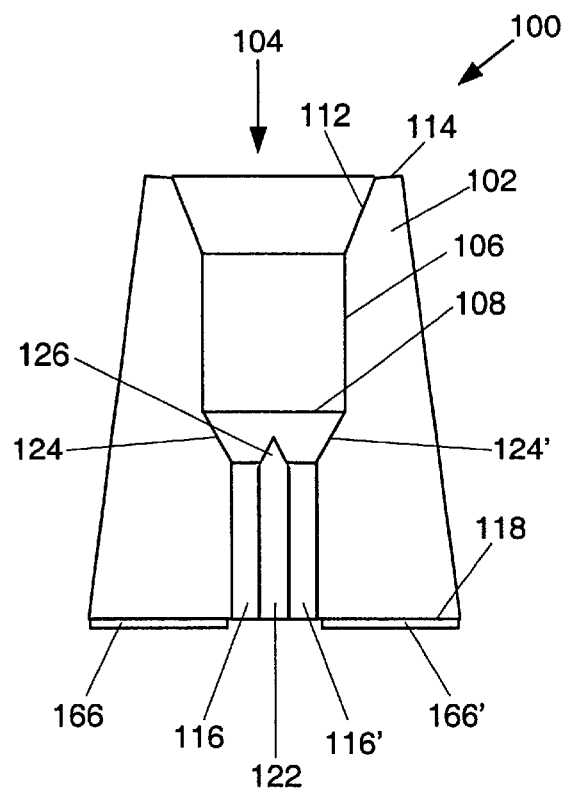
Figure 5F:
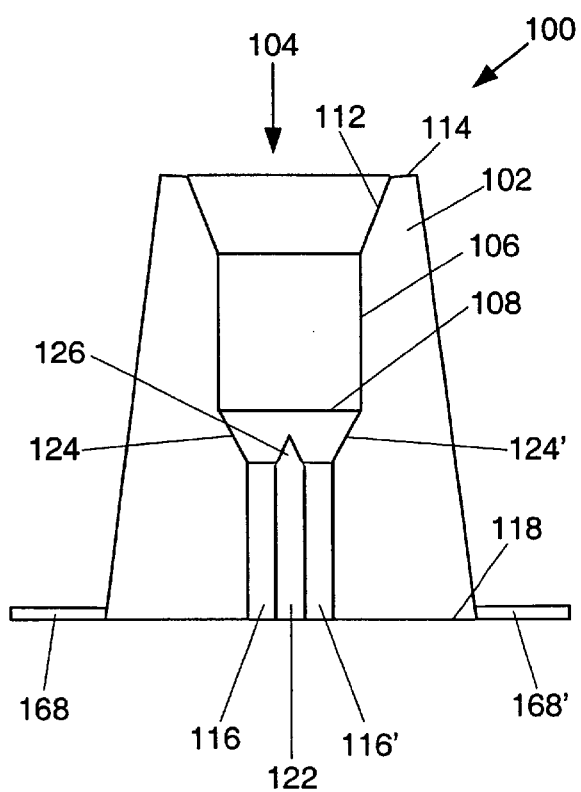

FIGS. 5d–5f illustrate additional substrate attachment mechanisms. These substrate attachment mechanisms are used to ensure proper alignment of the lead guide channels 116, 116 with corresponding vias (not shown in FIGS. 5d–5f) through the substrate 142. FIG. 5d illustrates the substrate attachment mechanisms 164 and 164' as non-locking guide pegs, which will not be attached to the substrate (not shown). The guide peg-type, substrate attachment mechanisms 164 and 164' may provide sufficient frictional attachment to hold the component retention socket 100 in place while the soldering of the component leads (not shown) are used to attach both the component retention socket 100 and the electronic component (not shown) to the substrate 142. FIG. 5e illustrates the substrate attachment mechanism 166 as a layer of adhesive material. FIG. 5f illustrates the substrate attachment mechanisms 168 as surface mounts, which are soldered to a top surface of the substrate, as known in the art.

Figure 6A:
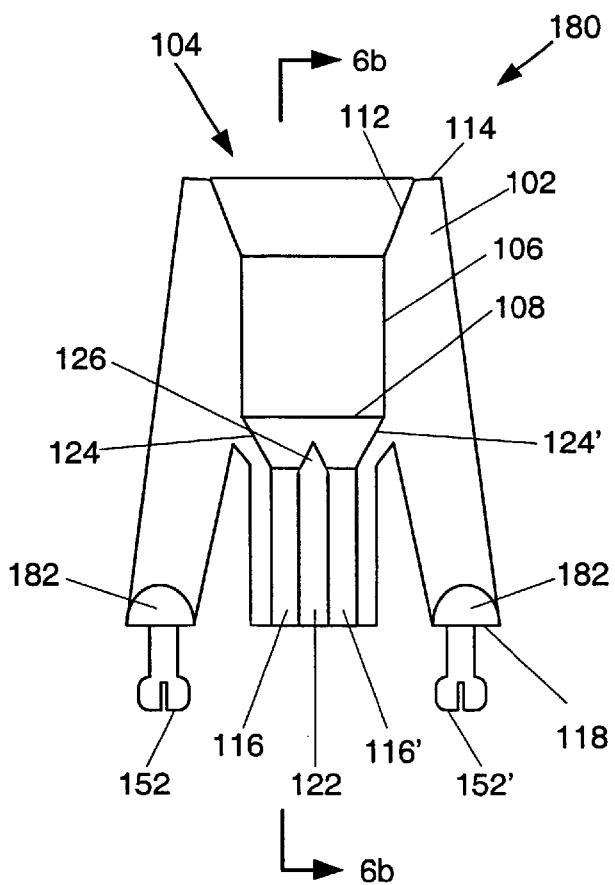
FIG. 6a is a side cross-sectional view of another embodiment of a component retention socket, according to the present invention.
Figure 6B:
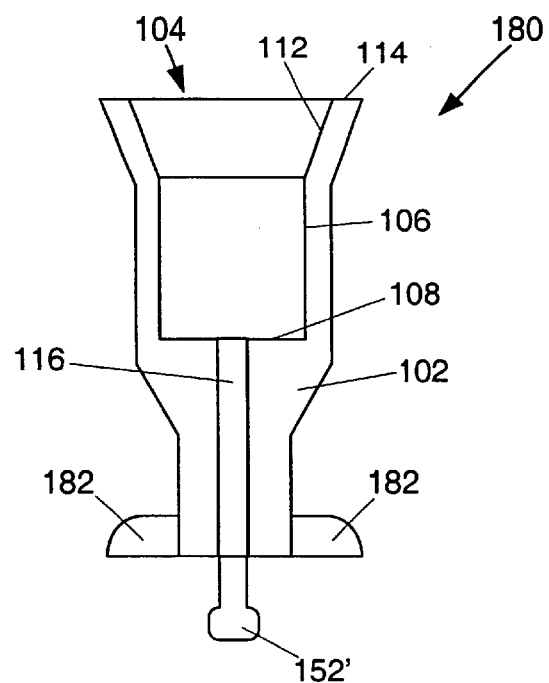
FIG. 6b is a side cross-sectional view of the component retention socket along lines 6b—6b of FIG. 6a, according to the present invention.
Figure 7:
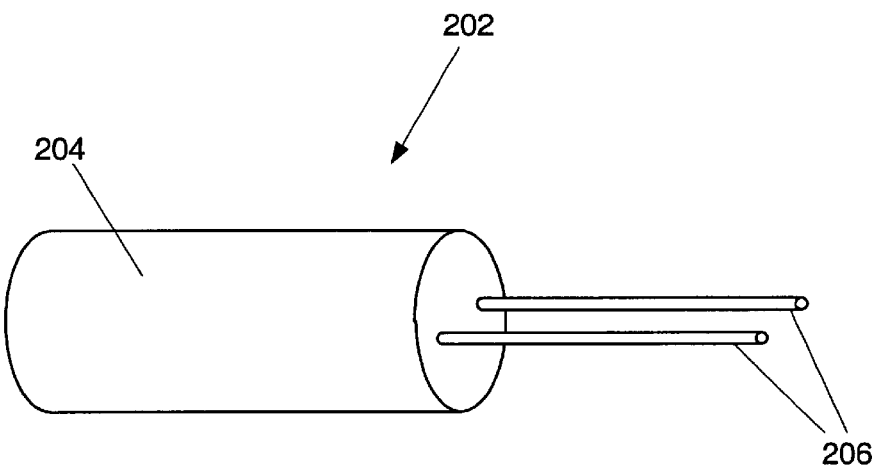
FIG. 7 is an oblique view of an electronic component, as known in the art.
Figure 8:
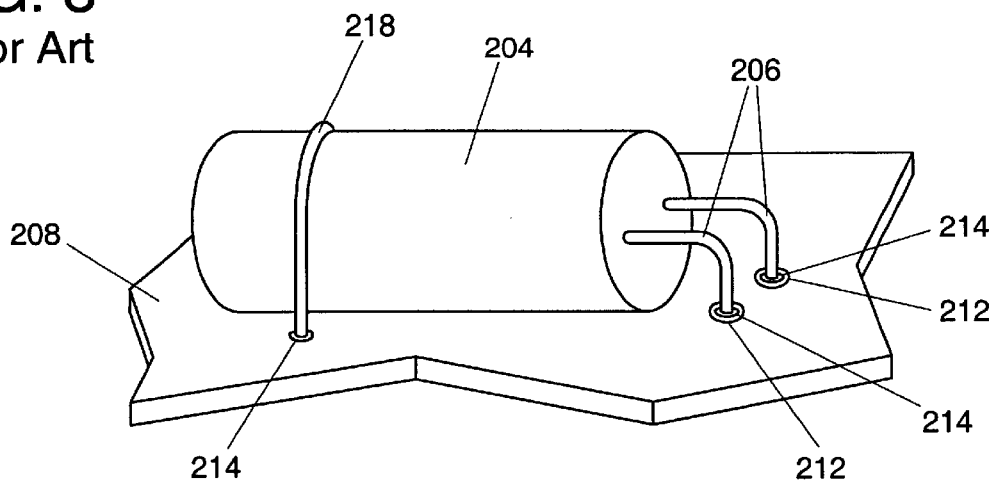
FIG. 8 is an oblique view of an electronic component attached to a substrate, as known in the art.
Figure 9:
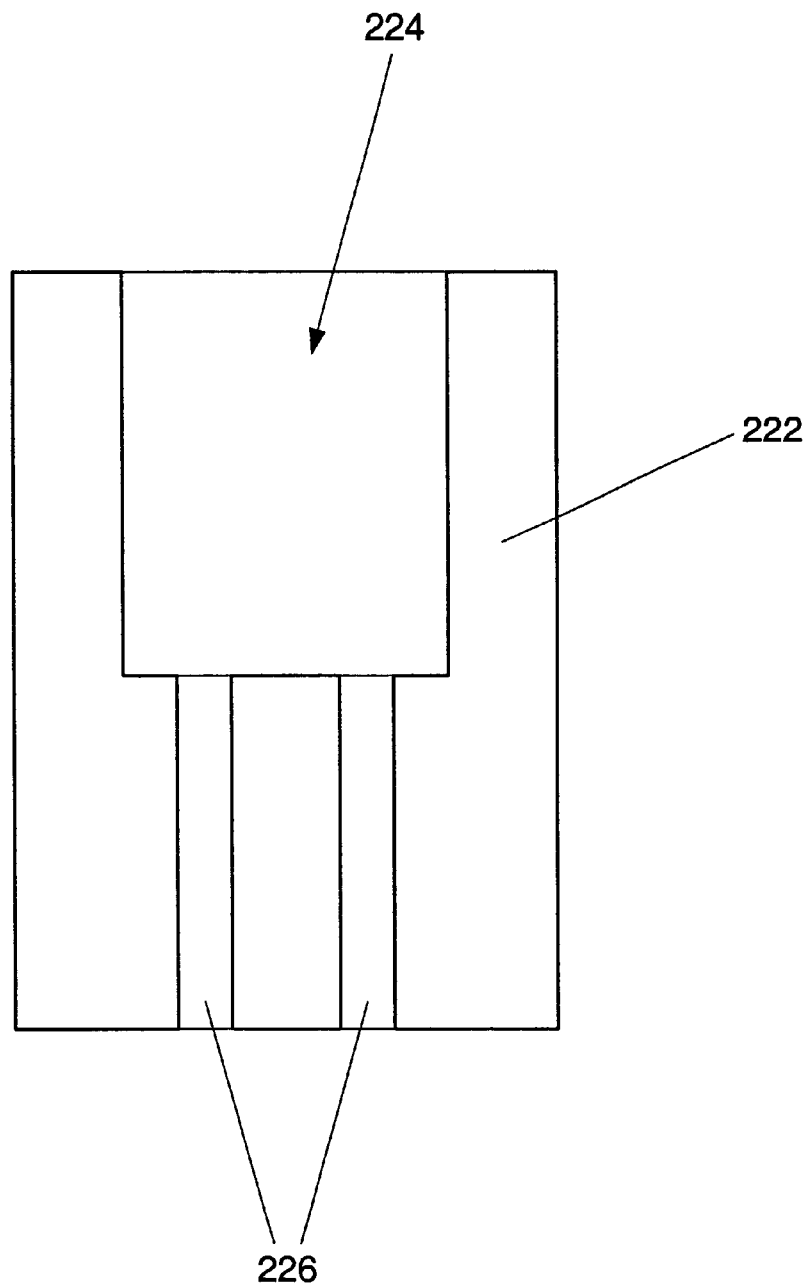
FIG. 9 is a cross-sectional view of an electronic component housing, as known in the art.

FIGS. 6a and 6b illustrate an alternative embodiment of a component retention socket 180. The component retention socket 180 is designed to require a minimum of substrate surface area and to use a minimum of material while retaining sufficient strength and utility. The component retention socket 180 may also include at least one extension 182, which will be planar to the substrate when the component retention socket 180 is attached thereto.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An electronic device, comprising:
   a substrate;
   a component retention socket attached to said substrate, wherein said component retention socket comprises:
      a housing having a first surface and a second surface;
      a recess defined within said housing, wherein said recess comprises a component chamber extending from said housing first surface to a component insertion stop within said housing and at least one lead guide channel extending from said component insertion stop to said housing second surface; and
      said at least one lead guide channel including at least one sloped wall extending from said component chamber; and
   an electronic component, having at least one lead attached to and extending therefrom, residing in said component chamber, wherein said at least one lead of said electronic component extends through said at least one lead guide channel and into at least one via in said substrate.

2. The electronic device of claim 1, wherein said housing comprises a polycarbonate material.

3. The electronic device of claim 1, further including a beveled guide proximate said housing first surface tapering into said component chamber.

4. The electronic device of claim 1, wherein said at least one sloped wall slopes from said component chamber to a point approximately one-quarter to one-third the distance from said component insertion stop to said housing second surface.

5. The electronic device of claim 4, further including at least one substrate attachment mechanism proximate said housing second surface.

6. The electronic device of claim 5, wherein said at least one substrate attachment mechanism is selected from the group consisting of solderable posts, split pegs, board locks, threaded posts and nuts, guide pegs, adhesive, and surface mounts.

7. The electronic device of claim 1, wherein said at least one lead guide channel further comprises a plurality of lead guide channels and further including a lead separator between each of said lead guide channels.

8. The electronic device of claim 7, wherein said lead separator includes a separator wedge.

9. A method of fabricating an electronic device, comprising:
   providing a substrate;
   abutting a component retention socket, having a recess defined therein, against said substrate;
   inserting an electronic component, having at least one lead attached to and extending therefrom, into said socket recess, wherein said at least one lead of said electronic component extends through at least one lead guide channel in said component retention socket and into at least one via in said substrate; and attaching said at least one component lead to said substrate.

10. The method of claim 9, wherein abutting a component retention socket to said substrate comprise abutting a polycarbonate material component retention socket.

11. The method of claim 9, wherein abutting said component retention socket against said substrate comprises attaching said component retention socket to said substrate with a substrate attachment mechanism.

12. The method of claim 11, wherein attaching said component retention mechanism comprises attaching said component mechanism to said substrate with a substrate attachment mechanism selected from the group consisting of solderable posts, split pegs, board locks, threaded posts and nuts, guide pegs, adhesive, and surface mounts.

* * * * *